United States Patent [19]

Gover et al.

[11] 4,065,729
[45] Dec. 27, 1977

[54] MONOLITHIC PNPN INJECTION LASER OPTICAL REPEATER

[75] Inventors: Avraham Gover; Ilan Samid; Chien-Ping Lee, all of Pasadena, Calif.

[73] Assignee: California Institute of Technology, Pasadena, Calif.

[21] Appl. No.: 677,529

[22] Filed: Apr. 16, 1976

[51] Int. Cl.[2] .............................................. H01S 3/19
[52] U.S. Cl. ................................. 331/94.5 H; 357/18; 357/19
[58] Field of Search ............... 331/94.5 H, 94.5 P, 331/DIG. 1; 250/199, 211 J, 213 A; 330/4.3; 357/18, 19

[56] References Cited

U.S. PATENT DOCUMENTS

| 3,434,776 | 3/1969 | Kern | 331/DIG. 1 |
|---|---|---|---|
| 3,568,087 | 3/1971 | Phelan, Jr. et al. | 331/94.5 |
| 3,733,561 | 5/1973 | Hayashi | 331/94.5 H |
| 3,887,876 | 6/1975 | Zeidler | 250/199 |

OTHER PUBLICATIONS

Y. Arai et al., "GaAs Light Emitting Device with Light Activated Negative Resistance", *Japan J. Appl. Phys.*, vol. 9, 1970, pp. 853-855.
H. F. Lockwood et al., "The GaAs P-N-P-N Laser Diode", IEEE *J. Quantum Electronics*, vol. QE 10, No. 7, July, 1974, pp. 567-569.

*Primary Examiner*—Stanley D. Miller, Jr.
*Assistant Examiner*—James W. Davie
*Attorney, Agent, or Firm*—Lindenberg, Freilich, Wasserman, Rosen & Fernandez

[57] ABSTRACT

A monolithic PNPN injection laser diode operating as an optical repeater is comprised of a direct band-gap semiconductor material, such as essentially GaAs, epitaxially grown in five layers with the first, third and fifth layers of GaAsAl and the second and fourth layers of GaAs, and all layers suitably doped to effectively form two complementary transistors interconnected for regenerative feedback between them with the second layer forming the base of one transistor and the collector of the other transistor, and the third layer forming the base of the other transistor and the collector of the one transistor. The PNPN laser diode thus produced has a V-I negative resistance characteristic. The second and fourth layers produce coherent laser beams in response to a light pulse received while the laser diode is biased off with its load line below its breakover voltage, thus switching the laser diode on. An externally stored charge is then discharged through the laser diode to produce the coherent laser beams until the discharging current is reduced below a threshold level. The laser diode is then cut off and the charge is restored in preparation for responding to another light pulse.

11 Claims, 7 Drawing Figures

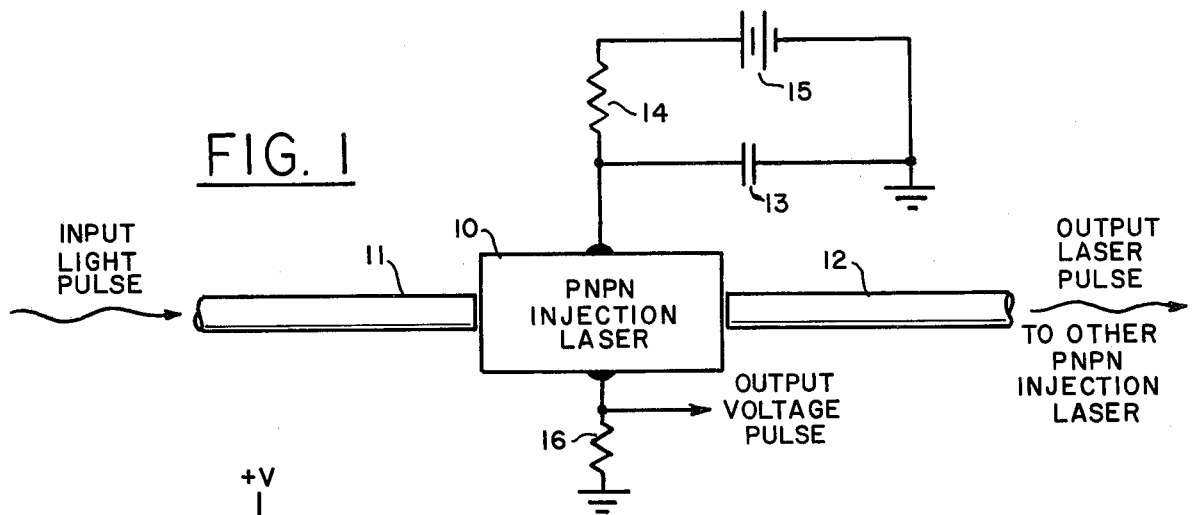
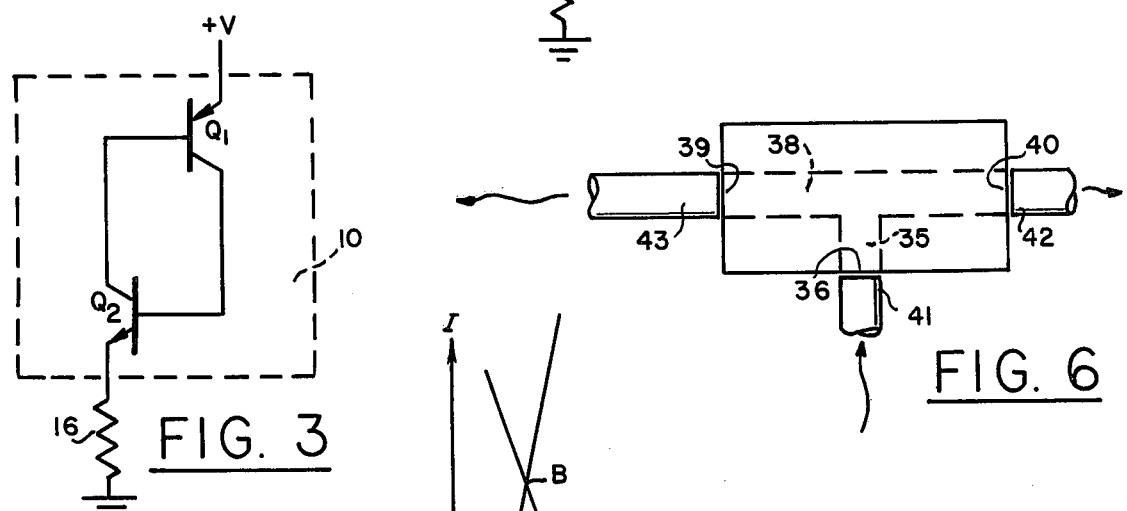
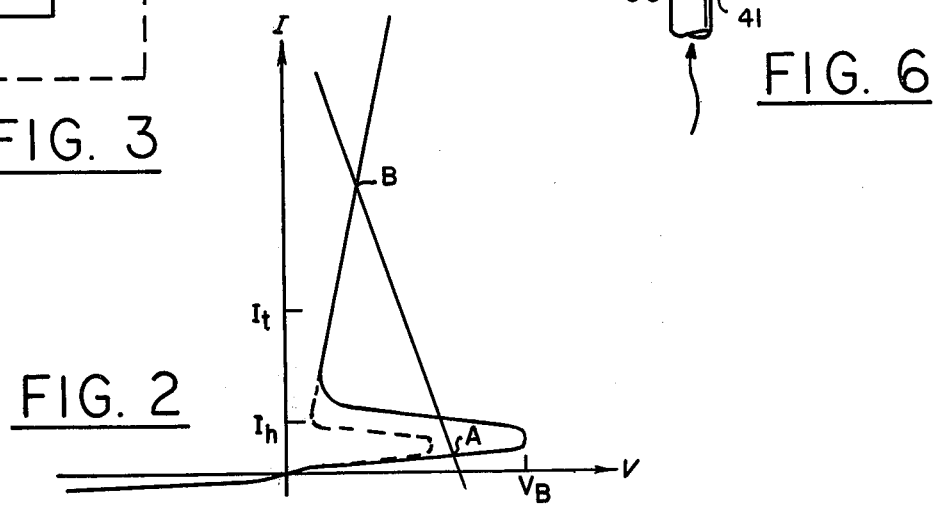
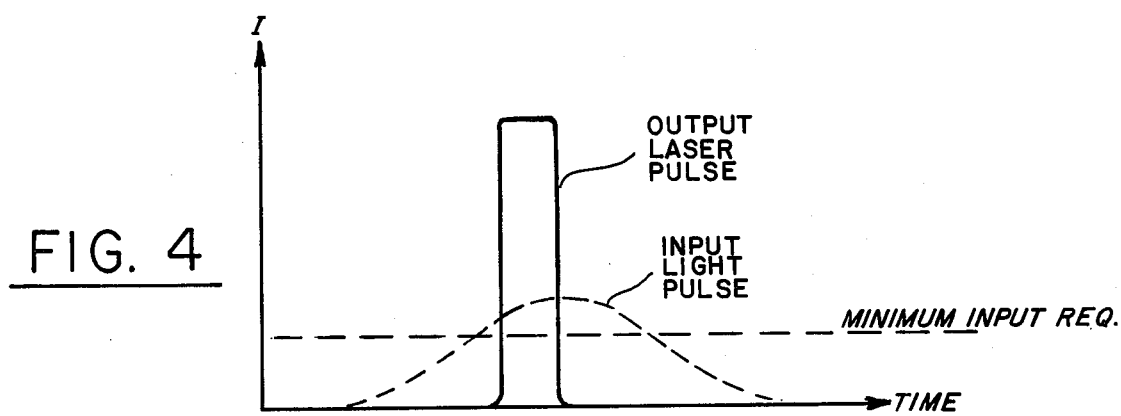

MONOLITHIC PNPN INJECTION LASER OPTICAL REPEATER

ORIGIN OF THE INVENTION

The invention herein described was made in course of, or under, a grant with the Office of Naval Research.

BACKGROUND OF THE INVENTION

This invention relates to an optical pulse repeater, and more particularly to a light-activated PNPN injection laser diode.

Since at least 1962, when W. P. Dumke demonstrated that lasing is possible in direct band-gap semiconductor material, such as gallium arsenide (see "Interband Transitions and Maser Action," *Phys. Rev.*, Vol. 127, page 1559), there has been great activity in studying and producing a laser action in semiconductor diodes. Once a p-n junction has been properly formed (and forward biased enough for there to be an active region in the vicinity of the junction where the population is inverted) the laser action is produced by stimulated emission upon passing a current through the junction. The mechanism for lasing is the flow of electrons over the top of the junction barrier from the n to the p side where they make transitions to empty electron states in the valence band and emit photons with energy approximately equal to the band gap, $E_g$. Simultaneously, holes flow to the n side where they recombine with electrons to further produce photons.

The interest in the laser action of p-n junctions has extended to multijunction injection lasers. For example, W. F. Kosonocky, Roy H. Cornely and I. J. Hegyi reported experimental data on the current controlled power output of multijunction GaAs lasers in "Multilayer GaAs Injection Lasers," *IEEE Journal of Quantum Electronics*, Vol. QE4, No. 4, p. 176, April 1968. See also "The GaAs P-N-P-N Laser Diode" by H. F. Lockwood, et al., *IEEE J. Quantum Electronics*, Vol. QE 10, No. 7, pp. 567–569, July, 1974. Another more recent investigation is reported in "Radiation Directivity Pattern of a Semiconducting Multilayer Structure" by Yu. P. Demidov, et al, *JETP Letters*, Vol. 12, No. 4, p. 117, Aug. 1970. Multilayer LED structures have also been investigated, particularly in respect to their operation as light-activated semiconductor-controlled rectifier (SCR) switches. (See Y. Arai, M. Sakuta and K. Sakai, "GaAs Light Emitting Device with Light Activated Negative Resistance, " *Japan. J. Appl. Phys.*, Vol. 9, p. 853, 1970, and D. Meyerhofer, A. S. Keezer and H. Nelson, "A Light-Activated Semiconductor Switch, " *J. Appl. Phys.*, Vol. 38, No. 1, p. 111, January 1967.) The object of the present invention is to provide a monolithic light activated multilayer injection laser useful as an optical pulse repeater or receiver. Such a repeater or receiver must detect weak and dispersed optical pulses arriving through an optical fiber, and then reshape the pulse for retransmission through an optical fiber or for detection and processing. Such a repeater is needed for long distance (kilometers) fiber optics communication.

SUMMARY OF THE INVENTION

A monolithic PNPN injection laser diode operating as an optical repeater is comprised of a direct band-gap semiconductor material, such as essentially GaAs doped in five layers to form a PNPN laser diode structure having a V-I negative resistance characteristic. The first, third and fifth layers are GaAlAs layers, and the second and fourth layers are thin GaAs layers. All layers are suitably doped to effectively form two complementary transistors interconnected as a regenerative feedback pair with the base of one common to the collector of the other, and vice versa, where the base of one transistor and the collector of the other transistor are comprised of a second layer and the base of the other transistor and the collector of the one transistor are comprised of a third layer. The fourth layer, doped to provide the base-emitter junction of the other transistor at one of its boundaries, will produce a laser beam coherent with the laser beam emitted by the second layer. In operation, the laser diode is biased off, i.e., biased with its load line below its breakover voltage, so that the diode is normally nonconductive. A light pulse received in the GaAs material of the second and fourth layers produces photocurrents in the GaAs layers to reduce the diode breakover voltage, thus switching the diode on. An externally stored charge is then discharge through the diode while it is on to produce lasing in the second and fourth layers until the discharging current drops below a threshold level. As current continues to drop below the holding current level of the negative resistance characteristic, the laser diode current is cut off. The result is emission of a high optical power laser pulse which can be transmitted through an optical fiber for a period controlled by the discharge rate of the externally stored charge, all in response to a longer low power light pulse coupled into the second and fourth layers of the diode through another optical fiber.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 1 is a schematic diagram of a monolithic PNPN injection laser optical repeater of the present invention.

FIG. 2 is a graph of the V-I characteristic of the PNPN injection laser of FIG. 1.

FIG. 3 is a circuit diagram of an analogous transistor structure of the PNPN junction laser of FIG. 1.

FIG. 4 is a timing diagram illustrating the shape of a transmitted light pulse produced by the repeater of FIG. 1 in response to a received pulse.

FIG. 6 is a plan view of a variation of the PNPN laser of FIG. 5.

DESCRIPTION OF PREFERRED EMBODIMENTS

Figure 5:
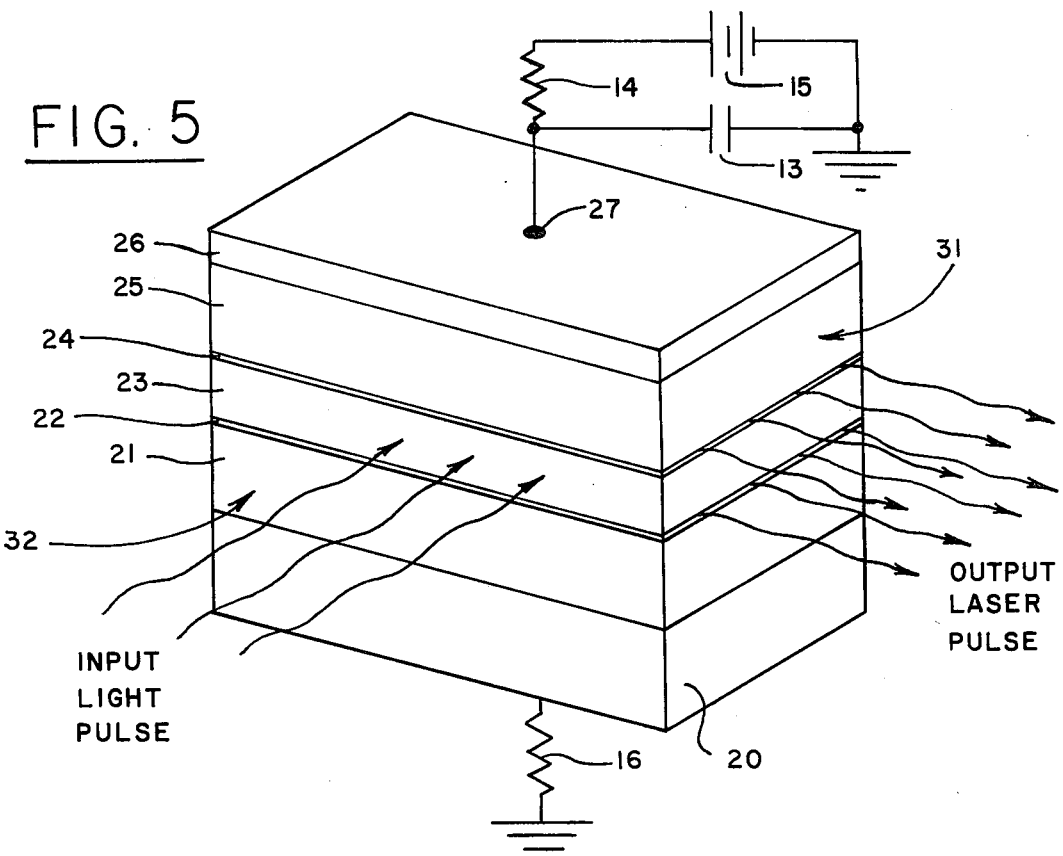
FIG. 5 is an isometric view of a PNPN laser and a schematic diagram of its external electrical circuit.

Referring to FIG. 1, a monolithic PNPN injection laser 10 is disclosed in a combination operating as an optical repeater that detects light pulses received over an optical fiber 11 which have degenerated from narrow high optical power pulses to wide low power pulses and retransmits, over an optical fiber 12, narrow high power pulses. The light pulses received over the optical fiber (guide) can be transmitted great distances (as much as a kilometer, or more) through the optical fiber 12 to another repeater or receiver (not shown).

The PNPN laser has a V-I negative resistance characteristic as shown in FIG. 2 comprised of a region in which forward bias does not increase current significantly until a breakover voltage $V_B$ is reached, at which point regenerative processes take place and increase the total current very rapidly.

An RC circuit comprised of a capacitor 13 and resistor 14, or other charge storage and switching electronic circuit, is employed to store charge from a DC source 15 while the PNPN laser is in the "off" condition. The source 15 is selected to bias the PNPN laser below its breakover voltage $V_B$ as illustrated in FIG. 2 which shows the negative-resistance characteristic of the laser and an exemplary load line A-B.

When the laser is transilluminated by an optical pulse of predetermined minimum optical power, photocurrent will lower the V-I characteristic (as shown by a dotted line) such that the new breakover voltage point is exceeded. The PNPN device then goes into an "on" condition of high conduction, and remains in that condition as long as the current supplied by the electronic circuit remains greater than a minimum holding value, $I_h$, at which time it reverts to the "off" condition. The forward bias current through the PNPN laser in the "on" condition is high enough to exceed a lasing threshold value, $I_t$, in order for stimulated emission to take place until the current supplied by the electronic circuit decreases to a point below where it is no longer able to maintain enough population inversion at the p-n junctions for lasing action. As the current continues to drop to a point below $I_h$, the device, then operating only as a multijunction light emitting diode, is cut off. The laser beam is by then shut off so that the laser output pulse of optical power is narrower than an output voltage pulse across a current limiting resistor 16.

The mechanism of operation can best be understood by visualizing the PNPN laser as consisting of the operation of two complementary junction transistors $Q_1$ and $Q_2$ interconnected as shown schematically in FIG. 3 to form a regenerative feedback pair. The first (PNP) transistor $Q_1$ has a common emitter current gain $h_{fe_1}$ and the second (NPN) transistor $Q_2$ has a common emitter current gain $h_{fe_2}$. The collector current of the respective transistors is thus given as follows:

$$I_{c_1} = h_{fe_1}(I_{c_2} + I_{co_1}) + I_{co_1} \quad (1)$$

$$I_{c_2} = h_{fe_2}(I_{c_1} + I_{co_2}) + I_{co_2} \quad (2)$$

$I_{co_1}$ and $I_{co_2}$ are the leakage currents of the respective transistors when they are cut off. The total current $I_A$ is the sum of the collector currents $I_{c_1}$ and $I_{c_2}$. Solving for this sum using equations (1) and (2) yields the following equation:

$$I_A = [(1 + h_{fe_1})(1 + h_{fe_2})(I_{co_1} + I_{co_2})]/[1 - h_{fe_1} \cdot h_{fe_2}] \quad (3)$$

When common emitter current gains $h_{fe_1}$ and $h_{fe_2}$ are both low, as is the case in cutoff, the total current $I_A$ is only a little higher than the sum of leakage currents $(I_{co_1} + I_{co_2})$. Under these conditions, the laser is said to be "cut off." When the product of current gains $h_{fe_1} \cdot h_{fe_2}$ approaches unity due to photogeneration of carriers, the total current $I_A$ increases and the circuit operation begins to regenerate, i.e., to increase collector current that is provided as base current to the other transistor such that each drives the other to saturation. Once in saturation, all junctions assume a forward bias with a total potential drop equal to that of a single p-n junction. Thus the total current $I_A$ is essentially limited only by the external electronic circuit.

Low impedance and high conduction are maintained as long as the total current exceeds the minimum holding level, $I_h$, and lasing occurs while the total current exceeds the threshold level, $I_t$, as noted above. This switching and lasing operation is very much like that of a GaAs PNPN laser investigated by H. F. Lockwood, et al, *IEEE Journal of Quantum Electronics*, Vol. QE-10 No. 7, pp. 567-569, July 1974. The operation of the present invention is, however, distinct in that it is triggered by an input light pulse of minimum amplitude as shown in FIG. 4. By contrast, the device of Lockwood is biased above the breakover voltage such that it is self triggering to operate like a relaxation oscillator. In the present invention, the PNPN laser is biased to operate like a monostable multivibrator externally triggered by an input light pulse to provide an optical pulse repeater.

In addition, the structure and order of the layer are such that high breakover, voltage ($V_B$), and consequently high ON current (point B in FIG. 2), can be obtained simultaneously with low lasing threshold due to optional carrier and optical confinement in the active regions (layers 22, 24), thus a far more efficient PNPN laser structure is attained compared to the device investigated by Lockwood, et. al., supra.

An exemplary PNPN laser useful in the present invention is comprised of a crystal of direct band-gap semiconductor material consisting essentially of N-type GaAs epitaxially grown with six P- and N-type layers on a substrate 20 Si, Te, Se or Sn doped ($n = 1 \times 10^{18}$ to $3 \times 10^{19} cm^{-3}$) as shown in FIG. 5. The first layer 21 produced using a liquid phase epitaxial growth system is $Ga_{1-x}Al_xAs$, $n$ type, Te or Sn doped ($n = 10^{17}$ to $10^{18} cm^{-3}$) where $x = 0.3$ to $0.6$ and the layer thickness is 1 to 5$\mu$. The second layer 22 is GaAs, $p$ type, Ge or Si doped ($p = 10^{17}$ to $10^{18} cm^{-3}$) of a thickness from 0.05 to 1$\mu$. The third layer 23 is $Ga_{1-y}Al_yAs$, $n$ type, either undoped or Te or Sn doped ($n = 10^{17}$ to $10^{18} cm^{-3}$) of a thickness from 1 to 5$\mu$, where $x$ is greater than $y$, and $y = 0$ to $0.3$. The fourth layer is similar to the second layer in all respects. The fifth layer is $Ga_{1-x}Al_xAs$, $p$ type, Ge or Zn doped ($p = 10^{17}$ to $10^{19} cm^{-3}$), where $x = 0.3$ to $0.6$ and the layer thickness is 1 to 5$\mu$. The sixth layer is GaAs, $p^+$type, Ge, Zn, Mn or Mg doped ($p+ = 10^{18}$ to $10^{21} cm^{-3}$) of a thickness of 0.5 to 2$\mu$.

Still other examples are possible. For example, other compounds can be used to provide laser output pulses at different wavelengths. The Ga and Al elements can be substituted, in whole or in part, by In, for example. The As element can be substituted, in whole or in part, by Sb or P. It is also possible to build a homojunction PNPN diode, instead of a heterojunction diode shown in FIG. 5, from GaAs material, for example. In that case there is need of growing only three layers, $p$, $n$ and $p$ type, on an N-type substrate. Doping level for each layer is $10^{17}$ to $10^{18} cm^{-3}$, and the thickness of each layer is 1 to 5$\mu$. However, the efficiency and lasing threshold current of such a device will be quite unfavorable.

A first n-p junction is between the first and second layers and a p-n junction is between the second and third layers. Another n-p junction is formed at a boundary of the fourth layer, which is at the boundary between the third and fourth layers in the example shown. The fifth P-type layer 25 made of $Ga_{1-x}Al_xAs$ is provided as a wall of low index of refraction, $n$, and high bandgap, $E_g$, as shown in FIG. 6. The last P-type layer 26 is provided to facilitate making ohmic contact 27 by metallizing the outer surface. The load resistor 16 is in ohmic contact with the N-type substrate. Alternatively, the injection laser chip may be connected directly to circuit ground, and the load resistor 16 may be connected between the ohmic contact 27 and the capacitor 13.

The epitaxially grown laser chip is cleaved with optically flat parallel faces on the front and back for lasing, as viewed in FIG. 5, namely a face 31 and its opposite face. The side face 32 and its opposite face are sawed (roughed), or confined in a stripe pattern by a lithographic process, to prevent lasing in a direction normal to the side faces and to quench high order transverse modes.

The active regions of p-n junctions formed by the GaAs layers and adjacent layers of GaAlAs emit light when the laser diode is in the ON condition. The light is generated and amplified mostly in these relatively thin GaAs layers. On each side of each of these GaAs layers there is a GaAlAs compound. The GaAlAs compound has a larger band gap and lower index of refraction than the thin GaAs layers, as noted hereinbefore. Consequently, most of the light emitted by the active regions of the p-n junctions in the second and fourth layers is confined to the optical cavity which consists of the second, third and fourth layers. The optical mode will be somewhat more confined to the second and fourth layers, especially when the aluminum concentration in the third layer is high. In that manner the first, second, third and fourth layers cooperate to provide the PNPN structure which exhibits a negative resistance characteristic necessary for switching, and the junctions necessary for lasing, while the second, third and fourth layers provide the optical cavity from which two lobes of light are emitted out of the side 31, and the opposite side, in response to an optical pulse received through an adjacent input side 32. The output side 31 is coupled by an optical fiber to another PNPN laser operating as a repeater, or as a receiver. The unused laser output side, such as the side opposite side 31 may be coated by a reflecting coating so that all of the laser light is emitted out of the one ouput side. In the case of operating the repeating as a receiver, an electrical pulse output is detected across the load resistor 16. Operation of a PNPN laser as a receiver is thus as a light pulse detector.

Besides confining the carriers and the optical mode when the device works as a laser (in the ON condition) the GaAlAs layers and particularly the center one (layer 23 in FIG. 5) has an important role in controlling the device characteristics in the OFF condition. To get laser operation in the ON condition, one would like to have the breakover voltage, $V_B$, large enough so that when switched to the ON condition (point B in FIG. 2), the current through the device will exceed the lasing threshold current $I_t$ and the device will lase. To attain high $V_B$ one must keep the gain of the transistors low:

$$h_{fe_1} \cdot h_{fe_2} < 1 \tag{4}$$

Different previous ways to attain low transistor gain (such as increasing the width of the active region) brought about increase in the lasing threshold current and/or decrease in the laser efficiency. In the exemplary devices described before it is possible to reduce the gain of the transistors considerably and still attain high $V_B$ by increasing the Al concentration in the central layer 23. This can be done without causing increase in the laser threshold or decrease in its efficiency.

As noted hereinbefore, an optical pulse is preferably coupled into the PNPN laser crystal by an optical fiber having its end polished optically flat through a side not involved in the lasing operation, such as the side 32. That side functions merely as a window for photons to enter the active regions of the p-n junctions involved in the lasing. The optical pulse could be coupled into the PNPN laser through the cleaved (optically flat) side opposite the output side 31, and that may be more convenient in fabrication, but in most cases undesirable, particularly when the optical pulse source is a similar laser optical repeater because an optical pulse would then be transmitted back to cause it to attempt to switch on again and thus introduce parasitic oscillations in the system.

An alternative geometry, shown in FIG. 6, could be a photolithographically defined T-shaped PNPN structure in which an intersecting branch 35 has its end 36 cleaved to receive an input light pulse and guide it to the center of a transverse branch 38 which has both of its ends 39 and 40 cleaved for lasing. An optical fiber 41 couples the input light pulse into the branch 35 while optical fibers 42 and 43 couple output laser pulses in opposite directions. If an output laser pulse is desired in only one direction, the optical fiber in the other direction is omitted and that end of the transverse branch is coated by a reflecting coating. Selective epitaxial growth of the layers in this T-shaped geometry may be provided through striped openings in an $Al_2O_3$ mask, a technique reported by I. Samid, C. P. Lee, A. Gover, and A. Yariv in a paper titled "Embedded Heterostructure Epitaxy: A Technique for Two-Dimensional Thin-Film Definition," *Appl. Phys. Lett.*, Vol. 27, No. 7, p. 405, October 1975, or by any other technique of stripe geometry laser definition.

To summarize the operation of a monolithic PNPN injection laser operating as an optical repeater in accordance with the present invention, the PNPN laser is normally in an "off" condition where the central junction between the second and third layers is reverse biased and no current flows through the semiconductor structure. When a light pulse enters the reverse biased junction, it injects photocurrent in this junction. The photocurrent is amplified by the regenerative process of the PNPN structure. This generated current in the second (P) and third (N) layers, is collector current of one of two paired transistors shown in FIG. 2, and at the same time is effectively base current for the other of the paired transistors. Since the other transistor is of a complementary type to the one, its collector current is effectively base current to the one of the two transistors. This provides a positive feedback loop as long as $\beta_1\beta_2 > 1$ where $\beta_1$ and $\beta_2$ are the common emitter gains of the one and the other of the transistors. When the transistors get deep enough into saturation, their common emitter gain drops until a steady state is achieved. At this time the device is in the "on" condition. A small portion of the injected carriers passes through the active regions of the thin second and fourth layers without recombination to maintain a steady state, but most of the injected carriers recombine in the active regions of the GaAs layers, i.e., electrons make transitions to empty states in the valence band and emit photons, while holes which flow to the N sides recombine with electrons and emit photons.

The negative resistance characteristic for the PNPN laser requires forward breakover $V_B$ to be exceeded in order to be turned on, but that voltage ($V_B$ in FIG. 3) is not exceeded to turn the PNPN laser on. Instead the PNPN laser is triggered on by a light pulse. The V-I characteristic curve is thus modified to have a lower breakover voltage which is then exceeded by the bias voltage. The extent to which the curve is modified depends upon the amplitude of the optical pulse received. Consequently, to turn the PNPN laser on, an input light pulse must be of a predetermined minimum amplitude to cause the breakover voltage point of the V-I characteristic curve to be reduced below a load line A-B shown in FIG. 3 established by resistor 16. This amplitude can be empirically determined in the design according to the sensitivity and noise immunity required in the system. A reduced V-I characteristic for an optical pulse of minimum intensity is shown by a dotted line in FIG. 3.

Once the laser PNPN is turned on, the capacitor discharges to a point where it can no longer maintain the required holding current and the PNPN device is turned off. Before that occurs, the capacitor discharges to a point where it can no longer maintain the lasing threshold current and the lasing action is terminated even though the received light pulse is still of sufficient amplitude to reduce the breakover voltage point below the load line. The result is a reshaped laser pulse transmitted out as shown in FIG. 4 where a degenerated input pulse is shown in dotted line and the reshaped laser pulse is shown in full line. A horizontal dashed line represents the minimum input light pulse amplitude required to shift the breakover voltage point of the V-I characteristic below the load line and turn the PNPN laser on. The rise time of the emitted light pulse is short due to the regenerative feedback discussed with reference to FIG. 3. The fall time of the emitted laser pulse is also very short since lasing stops abruptly once the current drops below the threshold. The length (width) of the emitted laser pulse is thus determined by the time constant of the RC or other circuit exterior to the monolithic PNPN injection laser operating as an optical repeater.

The second and third layers, which form the bases of the complementary transistors in the analagous structure (FIG. 2), should be thick enough relative to the diffusion lengths of electrons and holes, respectively, so that the individual transistors will have low enough gain at low current operation in order not to turn each other on at too low a voltage $V_B$. The Breakover voltage $V_B$ should be high enough so that the device can be biased with a voltage (lower than breakover) that is high enough to drive enough current through the device in the "on" condition, i.e., in the reduced breakover voltage so that the diode lasing threshold is exceeded. This consideration may require a compromise limit in the doping density of the layer on both sides of the central junction, and a compromise limit on the minimum dimension for the second and fourth layers in order to prevent punch-through breakdown of the reverse biased junction. However, the freedom to choose different concentrations of aluminum in the central layer 23 alleviates considerably the design problem. By increasing the value of $x$ in the formula $Ga_{1-x}Al_xAs$, the energy band-gap of the layer increases and the gain of the PNP transistor decreases considerably either because the emitted efficiency is reduced or because the base transport factor is reduced. The voltage $V_B$ can thus be made high while there is still freedom to design the other layers to optimize the lasing operation.

Design of the monolithic PNPN laser and its external switching circuit should be such that the laser can be turned on with low enough input light amplitude, but still high enough to prevent noisy operation. This again will require a compromise best achieved empirically for the particular application and operating environment of the present invention. It should also be designed so that "equivalent transistors" operation of the device will not go so deeply into saturation as to limit the shortness of the output optical pulse.

Figure 7:
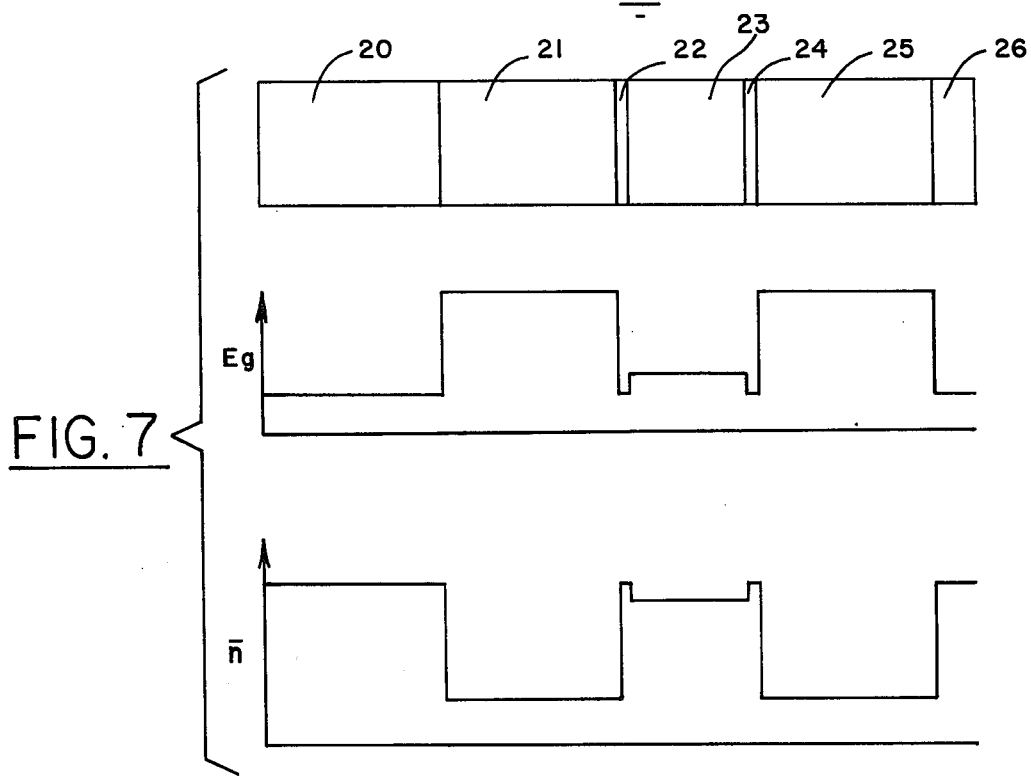
FIG. 7 is a diagram showing the band gap and refractive index of the layers in the PNPN structures of FIGS. 5 and 6.

It should be noted that the discussion with reference to FIGS. 1, 2 and 3 has been sufficiently general to applied to homojunction PNPN structures as well as to various combinations of PNPN heterojunction structures, while preferred embodiments of a monolithic PNPN laser described with reference to FIGS. 5 and 6 are a heterojunction structures in which a GaAlAs compound is used for the first, third and fifth layers. The GaAlAs compound is used in the heterostructure to confine the carrier injection and the light emitted to the second and fourth layers, which contain GaAs for the active regions of the p-n junctions. Confinement of the light is due to the lower index of refraction, $n$, of the GaAlAs compound, and confinement of the carrier injection is due to the greater band gap, $E_g$, of the GaAlAs compound, both as illustrated in FIG. 7 which plots separately the refractive index and band gap of the semiconductor material for the heterostructure of FIG. 5. The optical modes which propagate out of the second and fourth layers interact coherently to provide narrower lobes for the output laser pulse beams. The narrower lobes facilitate transmission of the output from one repeater to the next, preferably through an optical fiber. This feature of narrow angular radiation lobes is of importance also for the use of a monolithic PNPN injection laser optical repeater in other applications, as where the laser pulse beams are to be transmitted through the atmosphere over relatively short distances.

Although particular embodiments of the invention have been described and illustrated herein, it is recognized that modifications and variations may readily occur to those skilled in the art. For example, while only triple junction devices have been illustrated and described, it is obvious that additional P and N layers may be included, such as in a PNPNPN structure having five junctions with three forward biased and two reverse biased. Such structures include the basic PNPN structures of the present invention and therefore will operate for the same purpose in substantially the same way. Consequently, it is intended that the claims be interpreted to cover such modifications and variations.

What is claimed is:

1. An optical repeater comprising a monolithic PNPN injection laser for detecting an incident pulse of light of predetermined minimum amplitude and retransmitting a high amplitude laser pulse, said laser being comprised of a crystal of direct band-gap semiconductor material in at least four layers of N-type and P-type material to provide at least two planar p-n junctions of the same polarity separated by a planar p-n junction of opposite polarity, said junctions cooperating to form a structure having active regions where charged carriers recombine, said structure exhibiting a negative resistance V-I characteristic having a breakover voltage at which high conduction occurs, said high conduction being maintained so long as a minimum holding current level is maintained through said structure, said crystal having a pair of optically flat and parallel faces normal to said planar junctions, means for biasing said structure across said junctions in series at a voltage below said breakover voltage, means coupled to said biasing means for storing a predetermined quantity of charge to be discharged through said structure when switched to high conduction, and means for coupling said pulse of light of predetermined minimum amplitude into said planar p-n junctions thereby producing photocurrent and consequently regenerative high current through said junctions to cause population inversion with simultaneous emission of an output laser pulse from said junctions through at least one of said optically flat faces while said regenerative high current is above a predetermined threshold level for lasing, said threshold level being greater than said holding current level.

2. The combination defined in claim 1 including an optical fiber for guiding said laser pulse emitted through said at least one optically flat face over a great distance.

3. The combination defined in claim 1 including a resistor in electrical series with the discharge current path through said structure from said current storage means, said resistor controlling the discharge rate of said stored charge thereby producing both an electrical and a laser output pulse of predetermined duration.

4. The combination defined in claim 1 wherein said junctions are heterojunctions and said structure includes at least five layers, the first and fifth layers consisting essentially of compound material exhibiting a larger band gap and a lower index of refraction than the second and fourth layers, whereby said first and fifth layers facilitate optical confinement of said laser pulse which is amplified essentially in said second and fourth layers, and said first and fifth layers facilitate carrier confinement.

5. An optical repeater comprising a monolithic PNPN injection laser having a V-I negative resistance characteristic, said laser comprising a crystal of direct band-gap semiconductor material, said crystal having at least four planar layers of P-type and N-type material arranged to provide three rectifying junctions, one polarity for two of said rectifying junctions separated by the third rectifying junction of opposite polarity, and said crystal having a pair of optically flat and parallel faces normal to said planar layers, means for reverse biasing said third junction between the first and second junctions at a predetermined voltage below the breakover voltage of said V-I negative resistance characteristic selected to hold off current through said layers in series while forward biasing said two p-n junctions on both sides of said third junction, means coupled to said biasing means for storing a predetermined quantity of charge to be discharged through said layers in series once conduction through said third junction is initiated, and means for coupling a light pulse of predetermined minimum amplitude into said planar layers to cause photocurrent through said third junction, thereby injecting carriers and lowering the breakover voltage of the negative resistance characteristic of said PNPN injection laser below said predetermined voltage, a sufficient portion of said carriers flowing through the N-type and P-type layers of said third junction to maintain current flow independent of said light pulse for discharge of said stored charge and the balance of said carriers recombining radiatively to provide, through at least one of said optically flat faces, an output laser pulse the duration of which is determined only by the time required for said stored charge to be discharged to a point where current flow can no longer be maintained through said third junction above a lasing threshold level independent of said light pulse coupled into said layers.

6. The combination defined in claim 5 wherein said crystal includes a first layer of semiconductor material, a second layer of semiconductor material, a third layer of semiconductor material, a fourth layer of semiconductor material and a fifth layer of semiconductor material, and wherein each of said first and fifth layers has a larger band-gap and lower index of refraction than said second and fourth layers, whereby most of the light of said output laser pulse emitted is confined between the first and fifth layers.

7. The combination defined in claim 6 wherein said third layer has a larger band gap and lower index of refraction than the second and fourth layers, whereby injected carriers are confined to the second and fourth layers, facilitating low lasing current threshold, and whereby most of the light of said output laser pulse is confined to said second and fourth layers to provide coherently interacting optical modes which produce two narrow emitted beams of said laser pulse emitted.

8. The combination defined in claim 7 wherein said means for coupling a light pulse into said planar layers is comprised of an optical fiber having an input end adapted to receive a light pulse and its output end adapted to deliver said light pulse into said crystal.

9. The combination defined in claim 8 including an output optical fiber having an input end against a face of said crystal through which said laser pulse is emitted, whereby said laser pulse is guided by said output optical fiber.

10. A monolithic PNPN optical pulses repeater comprising a crystal of direct band-gap semiconductor material having a pair of parallel optically flat faces, said crystal being epitaxially grown in planar layers on a substrate consisting essentially of GaAs, at least four of said layers being doped alternately for negative and positive carrier type to provide a structure having three junctions, two end junctions of one polarity, p-n, and a current junction of opposite polarity, n-p, said structure having active regions where charge carriers recombine radiatively, means for biasing said central junction below its breakover voltage, thus forward biasing said end junctions for conduction when said central junction conducts, means for storing current for discharge through said junctions when said central junction conducts, means for coupling a light pulse into said reverse biased central junction to produce photocurrent through said central junction and to trigger conduction through the device which sustains current flow as long as said stored charge provides sufficient current through said central junction to hold said central junction conducting, thus discharging said stored charge through said three junctions in response to said light pulse, said current flow causing population inversion in said structure, and means for restoring said stored charge automatically once sufficient current is no longer sustained to hold said central junction conducting.

11. A monolithic PNPN optical pulse repeater as defined in claim 10 wherein a first layer produced on said substrate is of $Ga_xAl_{1-x}As$, where $x$ is less than unity; a second layer produced on said first layer is of GaAs; a third layer produced on said second layer is of $Ga_yAl_{1-y}As$, where $y$ is less than $x$; a fourth layer produced on said third layer is of GaAs; and a fifth layer produced on said fourth layer is of $Ga_xAl_{1-x}As$, whereby said first, third and fifth layers are provided with a larger band gap and a lower index of refraction than the second and fourth layers to facilitate carrier confinement in the second and fourth layers and optical confinement between the first and fifth layers.

* * * * *

UNITED STATES PATENT AND TRADEMARK OFFICE
CERTIFICATE OF CORRECTION

PATENT NO. : 4065729
DATED : December 27, 1977
INVENTOR(S) : Avraham Gover, Ilan Samid & Chien-Ping Lee.

It is certified that error appears in the above-identified patent and that said Letters Patent are hereby corrected as shown below:

In column 2, line 19, change "discharge" to --discharged--

In column 4, line 30, change "3 X $10^{10}cm^{-3}$)" to --3 X $10^{18}cm^{-3}$)--

In column 5, line 40, change "ouput" to --output--

In column 10, line 36 change "current" to --central--

In column 10, line 52, after "said" and before "structure" please add --active regions to produce an output laser pulse from said--

Signed and Sealed this

Eighteenth Day of April 1978

[SEAL]

Attest:

RUTH C. MASON
Attesting Officer

LUTRELLE F. PARKER
Acting Commissioner of Patents and Trademarks